United States Patent
Schaefer

(10) Patent No.: US 10,447,063 B2
(45) Date of Patent: Oct. 15, 2019

(54) WIRELESSLY ELECTRICALLY CHARGEABLE DEVICE HAVING A COATING THAT LOOKS METALLIC

(71) Applicant: Oerlikon Surface Solutions AG, Pfaffikon, Pfäffikon SZ (CH)

(72) Inventor: Ruediger Schaefer, Grafenhausen (DE)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 15/565,718

(22) PCT Filed: Apr. 14, 2016

(86) PCT No.: PCT/EP2016/058228
§ 371 (c)(1),
(2) Date: Oct. 11, 2017

(87) PCT Pub. No.: WO2016/166212
PCT Pub. Date: Oct. 20, 2016

(65) Prior Publication Data
US 2018/0123377 A1    May 3, 2018

Related U.S. Application Data

(60) Provisional application No. 62/147,649, filed on Apr. 15, 2015.

(51) Int. Cl.
*H02J 7/02* (2016.01)
*C23C 14/00* (2006.01)
(Continued)

(52) U.S. Cl.
CPC .......... *H02J 7/025* (2013.01); *C23C 14/0015* (2013.01); *C23C 14/35* (2013.01); *H02J 50/10* (2016.02)

(58) Field of Classification Search
CPC ............ H02J 7/025; H02J 5/005; H02J 17/00
(Continued)

(56) References Cited

U.S. PATENT DOCUMENTS

| | | | | |
|---|---|---|---|---|
| 2011/0065530 A1* | 3/2011 | Molinari | ............ | A63B 37/0003 473/378 |
| 2014/0159502 A1* | 6/2014 | Shimokawa | ............ | H02J 17/00 307/104 |
| 2014/0183678 A1* | 7/2014 | Keckes | ............... | H03K 17/955 257/433 |

FOREIGN PATENT DOCUMENTS

| | | |
|---|---|---|
| DE | 10 2011 018 364 A1 | 10/2012 |
| DE | 102011018364 A1 * | 10/2012 ........... H03K 17/955 |
| WO | 2014/170004 A1 | 10/2014 |

OTHER PUBLICATIONS

International Search Report for PCT/EP2016/058228 dated Jun. 14, 2016.

* cited by examiner

*Primary Examiner* — David V Henze-Gongola
(74) *Attorney, Agent, or Firm* — Pearne & Gordon LLP

(57) ABSTRACT

An electronic device, including at least one electronic component that can be used as an electrically and wirelessly chargeable terminal or as a transmitting device for such a terminal. The electronic device has a plastic surface that enables electromagnetic interaction between the electronic component and an external electronic component in the frequency range of 110 to 205 kHz. The plastic surface has a coating having a metallic appearance, wherein the coating includes at least one layer that looks metallic and at least one semiconductor material or at least one dielectric.

13 Claims, 1 Drawing Sheet

(51) Int. Cl.
*H02J 50/10* (2016.01)
*C23C 14/35* (2006.01)
(58) Field of Classification Search
USPC .......................................... 320/108; 307/104
See application file for complete search history.

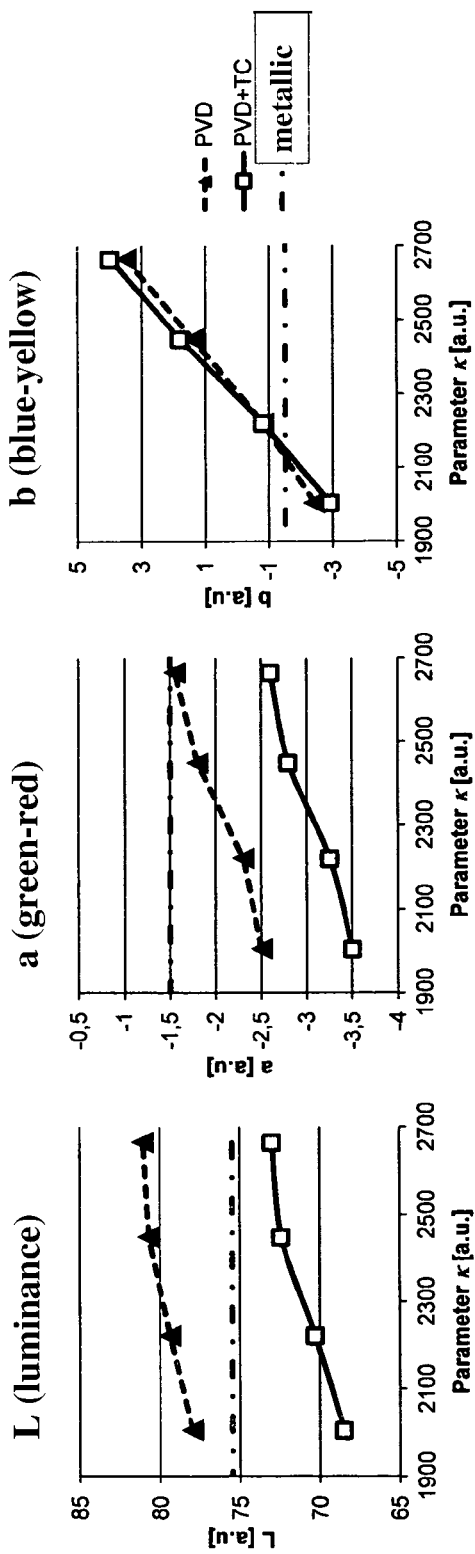

WIRELESSLY ELECTRICALLY CHARGEABLE DEVICE HAVING A COATING THAT LOOKS METALLIC

The present invention relates to a cordless electrically rechargeable device with a metallic-looking coating.

Bay way of example of such devices one can mention mobile telephones or tablets. It is nowadays possible, and also already common, to equip mobile telephones with inductive receivers, so that they can be recharged wirelessly according to the Qi standard. If no such receiver is integrated in the mobile telephone, a retrofit adapter can be used which can be connected to the electrical connection of the mobile telephone.

Devices equipped with such inductive receivers or their accumulators can then be charged with corresponding inductive charging devices, which can replace common charging devices for charging via the electrical connection. This creates a certain degree of comfort because the mobile phone must now be placed for charging on the charging tray of the inductive charger connected to the power supply.

Now it is so that design plays a central role, especially in the field of mobile phones and tablets, and sometimes triggers the purchase decision. Especially in the case of high-quality brands, a metallic look is often used in this context.

The metal coating of plastic surfaces is a known technique in this case, but this has the great disadvantage that metallic coatings are conductive in their surface and thus inductive and therefore cable-free charging is not possible. In particular, it is probably the reason to see why some mobile phones and/or tablet makers producing mainly high-quality brands do not offer devices which would be loadable according to the Qi standard.

The problem thus arises as follows: on the one hand, metallic glossy plastic surfaces are required, which on the other hand must not shield the underlying charging device. Particular challenges arise in the problem in that the metallic surfaces are characterized both by their degree of gloss and by their color tone (CIE-Lab values).

It is therefore the object of the present invention to overcome the above-described problem or at least to mitigate it.

According to the invention, the object is achieved in that the decorative surface of a device equipped with an inductive charging device is coated with a thin semiconductor layer which is preferably between 1 nm and 100 nm thick. Silicon is particularly suitable for this purpose. This coating can, for example, be carried out by means of physical vapor deposition (PVD). Density and therefore preferred layers can be achieved by means of a magnetron sputtering method.

The invention will now be explained in more detail by means of examples.

According to a first embodiment of the present invention, a silicon layer 35 nm thick (i.e. in the thickness range of 1 μm to 100 μm) is applied as a semiconductor layer to the surface of a plastic housing which protects an electronic component from the environment. In order to smooth possible surface structures, a primer (UV acrylic lacquer) is first applied to the surface. After applying the Si layer by means of magnetron sputtering, a cover layer (UV acrylic lacquer) is applied in the present example for additional protection of the thin Si layer. The result is a bluish to yellowish metallic shimmering surface. Due to the low electrical conductivity of silicon, the inductive charging device is not electrically or capacitively shielded.

In order to achieve additional colors, it is possible, for example, to color the cover layer semi-transparent.

According to a second embodiment of the present invention, the semiconductor layer is formed as a layer system. This can be used, for example, as an alternating layer system with a semiconductor, for example Si and a dielectric, e.g. with $SiO_2$. The overall thickness of the Si layers should in this case again be in the range between 10 nm and 100 nm. In order to obtain the desired transmission and reflection characteristics in the visible range of the spectrum of electromagnetic radiation, high-performance optimization programs for optical thin films are now available to the skilled worker. Therefore, a more detailed embodiment is omitted here.

According to a third embodiment of the present invention, germanium is used as the semiconducting material for the coating. This coating can also be designed as a single thin monolayer with a thickness of 1 μm to 100 nm or as an interlayer system with one or more dielectrics such as, for example, $SiO_2$. In particular, Ge can also be combined with Si to achieve the desired effects.

The three embodiments are described herein with primers. Such a lacquer layer, which is arranged between the PVD layer and the substrate, can be referred to as basecoat. Depending on the surface quality, this basecoat may be dispensed with.

According to the above-described invention, it is now possible for example to produce mobile telephones and/or tablets which have a metallic appearance and which can be charged wirelessly, for example by means of an inductive receiver integrated in the device. The invention also relates to the above-mentioned retrofit adapters, which can now also be given a metallic appearance without any problems.

The idea according to the invention finds its field of application primarily on electrical and cordless rechargeable terminals such as, among others, mobile phones, MP3 players, voice recorders, external storage media and the like, as well as peripherals thereof, such as among others associated charging stations, retrofitting adapters, holders, and the like. However, the application of the present invention extends not only to consumer goods in the private sector but is also intended for applications in the medical technology or the automobile sector.

Since 2008, wireless energy transmission has been commonly combined under the term "Qi standard". The functioning of a cordless charging device can basically be implemented in two ways. On the one hand, radiation-free energy transmission and, on the other, radiation transmission. The first possibility of energy transfer uses the coupling of two coils by magnetic induction, one coil being installed in the "transmitter", the other in the "receiver". This transmission capability is only suitable for short distances between transmitter and receiver and can also be described by the terms "magnetic resonance coupling" resp. "magneto-dynamic coupling". It is carried out according to the Qi standard in the frequency range from 110 to 205 kHz and is therefore classified as being in the "long wave range". The other type of transmission uses the transmission of electromagnetic waves or laser beams and requires a special "receiving device" which is capable of converting the radiation into electrical energy.

For the design of the external appearance of plastic surfaces nowadays a whole series of different processes are known. The one skilled in the art is aware that the production of a metallic surface on plastics is possible, among others by electroplating, or also by PVD methods. Therefore, no further discussion of these methods is given.

It is also known to the one skilled in the art that metallic single-layer or multilayer systems can not be used in special applications, because the metallic character of the metal layers and/or of metal-containing layers allows no or only an attenuated electromagnetic interaction with external electromagnetic field sources, such as for example an induction coil of a charging station.

In order to solve the above-mentioned problems, that is to say essentially to improve the surface finish of plastic components in order to obtain metallic-looking surfaces, the disadvantageous property of the electrical surface conductivity must be avoided, whereby the inventor could not easily resort to known technologies.

However, to the surprise of the inventor, it has been found that the use of a largely known method for the design of metallic surface phenomena on sanitary and automotive components can be used in a modified form for the solution of the above-mentioned object. A method principle which is sufficiently described in WO2014170004 has been used to implement the idea according to the invention.

The avoidance of the above-mentioned disadvantages, in particular the electrical conductivity, could thus largely be circumvented by using electrically insulating or semiconducting materials, i.e. essentially non-metallic materials, for the PVD layer. Moreover, it was surprisingly found that the metallic-looking coatings according to the invention essentially do not hinder the inductive coupling, i.e. an electromagnetic interaction, in the frequency range of approximately 110 to 205 kHz, as used for the Qi standard. As mentioned in the three basic exemplary embodiments mentioned above, in addition to the semiconductor materials, silicon and germanium, a combination of one or more semiconductors, or else of one or more semiconductors with one or more dielectrics, such as silicon dioxide, can also be used to optimize the optical appearance.

In a further embodiment, the metallic-looking coating can be formed as a multilayer layer structure which comprises two or more metallic-looking, alternately deposited layers, wherein at least one of the layers consists of one or more semiconductor materials and an overlying or underlying layer of one or more dielectrics.

The user is now offered a powerful process by means of suitable material selection and combination, as well as the process parameters adapted to the component geometry, which in addition to being environmentally friendly allows the coating of large quantities in a short time. When coating the plastic substrates, care is taken that the coating temperatures are below about 85° C., which makes this method particularly suitable for temperature-sensitive plastics.

The present invention has been tested on plastic parts and surprisingly shows the possibility of the color values in any color space, e.g. the CIE lab color space. This may be adjusted, among others, by the choice of semiconductors resp. of dielectrics, as well as their combination in the form of multilayer constructions, and in particular their layer thickness. FIG. 1 shows the color values L, a and b for two layer structures according to the invention as a function of their respective overall layer thickness. The parameter κ here represents a product of the coating current used for the deposition and the coating time, which therefore reflects the layer thickness only indirectly. However, this has no effect on the qualitative course of the color measurement values of the inventive layers. By comparison, silicon layers deposited on a plastic surface without PVD or with an optional topcoat (PVD+TC) are plotted against a reference by means of a PVD method. The reference consists of a galvanically applied chromium metal layer (metallic), the color values of which are indicated as constant over the layer thickness considered for the PVD layers. It is well evident that the use according to the invention of a silicon layer permits a very accurate approximation to the optical appearance of a chromium metal layer. The optional use of a UV-curable lacquer layer between the substrate material and the optically active PVD layer is mentioned at this point, but since it has no influence on the coloration, it will not be discussed any further. In contrast thereto, it can be seen that the application of a covering layer, referred to as topcoat (TC), which preferably consists of a UV-curable lacquer mixture, can advantageously have an effect on the optimization of a desired degree of gloss. This topcoat can alternatively be composed of a two-component polyurethane (PU) lacquer layer, which has the advantage that it can be dyed half-transparently. The use of such a topcoat again increases the diversity in color.

A variety of metallic color effects can thus be achieved relatively simply. Apart from the metallic colors which are reminiscent of silver, other metallic colors such as, for example, gold or copper. Within the scope of the idea according to the invention, metallic-silvery colors are used for using the abovementioned PVD layers for plastic housings of electronic components. In the CIE lab color space, the preferred range of use is therefore $20<L<98$, $-10<a<10$, as well as $-10<b<10$, as particularly preferred $40<L<90$, $-5<a<5$ as well as $-5<b<5$. However, this is not to be construed as a limitation to the invention.

It has been found that when the overall layer thicknesses according to the invention of the metallic-looking layer, comprising either individual layers of one or more semiconductors, or one or more dielectrics, or else multilayer layer structures consisting of two or more metallic-looking alternately deposited layers, wherein at least one of the layers consists of one or more semiconductor materials and an overlying or underlying layer of one or more dielectrics, are in the range from 5 to 200 nm, preferably in the range from 10 to 100 nm, an electromagnetic interaction between the electronic component and an external electronic component in the frequency range from 110 to 205 kHz becomes possible.

The particularly thin layers also offer further advantages which are suitable for use on housings of electronic components. For example, the low layer thickness makes it possible to backlight the metallic-looking surfaces from within the component interior. This can, for example, be used for mobile radio devices and their charging stations to indicate the charge state of the device by means of differently colored light effects. In addition, there is a possibility, for example through targeted laser ablation of the thin PVD layer, to use backlighting to make special lettering, logos, and the like more attractive. The comparatively low layer thickness also has a positive effect on the flexibility of the coated plastic surfaces compared to pure, but slightly thicker metal layers. Furthermore, electronic devices are often exposed to direct skin contact of their users, which also requires a certain corrosion resistance, as well as non-toxicity, of the coating and can be advantageously achieved in the present invention.

The approach according to the invention for solving the above-described problems thus has the following considerable advantages over the prior art:

Production of metallic-looking surfaces of electronic devices which can be used according to the "Qi standard"

Lacquer coating, UV curing as well as PVD processes for the production of surfaces with a metallic appearance that are relatively easy-to-achieve for series production Avoiding electrical and/or magnetic interference of the metallic-looking surface with the electronic component below High versatility in color design for metallic appearance Setting the desired degree of gloss is relatively easy to achieve Increased environmental friendliness of the PVD process compared to, for example, electroplating Low process temperatures allow surface refinement of many commonly used materials High corrosion resistance Enabling flexible structures by using thin, non-conductive layers Possibility of introducing symbols, logos, and the like Possibility of punctual and/or extensive backlighting of the coating In summary, an electronic device is described that comprises at least one electronic component that can be used as an electrically and wirelessly chargeable terminal or as a transmitting device for such a terminal, wherein the electronic device has a plastic surface that enables electromagnetic interaction between the electronic component and an external electronic component in the frequency range of 110 to 205 kHz, characterized in that the plastic surface has a coating having a metallic appearance, wherein the coating comprises at least one layer that looks metallic and that comprises at least one semiconductor material or at least one dielectric.

Additionally, a method for producing an electronic device with a metallic-looking layer is presented, the method comprising the following steps:

Providing a plastic surface of the electronic device

Generating a metallic color impression by depositing a metallic-looking layer by means of a PVD method, wherein the metallic-looking layer comprises at least a semiconductor material or dielectric.

In a preferred embodiment, the method for producing an electronic device with a metallic-looking layer additionally comprises the following steps:

Providing a plastic surface of the electronic device

Applying a UV-curable lacquer as a layer to the plastic surface and curing the UV-curable lacquer layer by means of predominantly UV radiation prior to deposition of the metallic-looking layer as described above, and/or Application of a UV-curable lacquer as topcoat on the metallic-looking layer Curing of the topcoat by means of predominantly UV radiation.

What is claimed is:

1. An electronic device comprising at least an electronic component which can be used as an electrical and cordless rechargeable terminal or as a transmitter for such a terminal, wherein the electronic device has a plastic surface which provides an electromagnetic interaction between the electronic component and an external electronic component in the frequency range of 110 to 205 kHz, wherein the plastic surface has a coating with a metallic appearance, the coating comprising at least one metallic-looking layer which comprises at least one semiconductor material or at least one dielectric, wherein the color value of the metallic-looking coating in the CIE lab space is within the values for $20<L<98$, $-10<a<10$, and $-10<b<10$, and wherein the thickness of the coating is configured to allow for semi-transparency, allowing for view of one or more light elements disposed under the coating.

2. Electronic device according to claim 1, wherein the at least one metallic-looking layer consists of one or more semiconductor materials.

3. Electronic device according to claim 1, wherein the at least one metallic-looking layer consists of one or more dielectrics.

4. Electronic device according to claim 1, wherein the coating is formed as a multilayer layer structure comprising two or more metallic-looking, alternately deposited layers, wherein at least one of the layers consists of one or several semiconductor materials and an overlying or underlying layer of one or more dielectrics.

5. Electronic device according to claim 1, wherein at least one of the layers comprising semiconductor material comprises silicon as a semiconductor material.

6. Electronic device according to claim 1, wherein at least one of the layers comprising the dielectric comprises silicon dioxide as the dielectric.

7. Electronic device according to claim 1, wherein the layer thickness of the metallic-looking layer or the total layer thickness of the metallic-looking layers is between 5 and 200 nm.

8. Electronic device according claim 1, wherein the coating comprises at least one UV-curing lacquer between the plastic surface and the metallic-looking layer or layers.

9. Electronic device according to claim 1, wherein the coating comprises at least one lacquer as a topcoat for finishing the coating off against the environment, wherein the lacquer is a UV-curing or a semi-transparent colored two-component polyurethane lacquer.

10. Electronic device according to claim 1, wherein it is a cordless rechargeable device according to the Qi standard.

11. Method for producing an electronic device having at least an electronic component which can be used as an electrical and cordless rechargeable terminal or as a transmitter for such a terminal, wherein the electronic device has a plastic surface which provides an electromagnetic interaction between the electronic component and an external electronic component in the frequency range of 110 to 205 kHz, and wherein the plastic surface has a coating with a metallic appearance, the coating comprising at least one metallic-looking layer which comprises at least one semiconductor material and at least one dielectric layer, wherein the method comprises the following steps:

providing a plastic surface of the electronic device;

generating a metallic color impression by depositing a metallic-looking layer by means of a PVD method, wherein the metallic-looking layer comprises the at least one semiconductor material and the at least one dielectric layer, wherein the color of the coating is adjusted by means of a combination of and the selection of the at least one semiconductor layer and the at least one dielectric layer in the form of a multilayer layer structure, and wherein the thickness of the coating is configured to allow for semi-transparency, allowing for view of one or more light elements disposed under the coating.

12. Method for producing an electronic device according to claim 11, wherein the method comprises the following steps:

applying a UV-curable lacquer as a layer onto the plastic surface and curing the UV-curable lacquer layer by means of predominantly UV radiation before the deposition of the metallic-looking layer;

and/or
   applying a UV-curable lacquer or a semi-translucent colored two-component polyurethane lacquer as topcoat onto the metallic-looking layer
   curing the topcoat by means of predominantly UV radiation.

13. Method for producing an electronic device having at least an electronic component which can be used as an electrical and cordless rechargeable terminal or as a transmitter for such a terminal, wherein the electronic device has a plastic surface which provides an electromagnetic interaction between the electronic component and an external electronic component in the frequency range of 110 to 205 kHz, and wherein the plastic surface has a coating with a metallic appearance, the coating comprising at least one metallic-looking layer which comprises at least one semiconductor material or at least one dielectric, wherein the method comprises the following steps:
   providing a plastic surface of the electronic device;
   generating a metallic color impression by depositing a metallic-looking layer by means of a PVD method, wherein the metallic-looking layer comprises at least one semiconductor material and at least one dielectric layer, wherein the color of the coated surface is adjusted by adapting the layer thickness of the coating or of the metallic-looking layer or of the multilayer layer structure, and wherein the thickness of the coating is configured to allow for semi-transparency, allowing for view of one or more light elements disposed under the coating.

* * * * *